(12) United States Patent
Balimann et al.

(10) Patent No.: US 12,736,871 B2
(45) Date of Patent: Sep. 15, 2026

(54) SURFACE TREATMENT FOR REPLICATION

(71) Applicant: NILT Switzerland GmbH, Horgen (CH)

(72) Inventors: Martin Balimann, Zurich (CH); Moritz Schmidlin, Zurich (CH); Robert Lenart, Rapperswil (CH); Tobias Senn, Zurich (CH)

(73) Assignee: NILT Switzerland GmbH (CH)

( * ) Notice: Subject to any disclaimer, the term of this patent is extended or adjusted under 35 U.S.C. 154(b) by 82 days.

(21) Appl. No.: 18/010,623

(22) PCT Filed: Jun. 15, 2021

(86) PCT No.: PCT/EP2021/066070
§ 371 (c)(1),
(2) Date: Dec. 15, 2022

(87) PCT Pub. No.: WO2021/255007
PCT Pub. Date: Dec. 23, 2021

(65) Prior Publication Data

US 2023/0229075 A1 Jul. 20, 2023

Related U.S. Application Data

(60) Provisional application No. 63/039,579, filed on Jun. 16, 2020.

(51) Int. Cl.
*G03F 7/00* (2006.01)
*G02B 5/18* (2006.01)

(52) U.S. Cl.
CPC ......... *G03F 7/0002* (2013.01); *G02B 5/1852* (2013.01); *G02B 5/1857* (2013.01); *G03F 7/0005* (2013.01)

(58) Field of Classification Search
CPC ...... B29D 11/00307; B29C 39/10; G02B 7/02
See application file for complete search history.

(56) References Cited

U.S. PATENT DOCUMENTS 6,919,158 B2 7/2005 Kawamura et al.
8,338,502 B2 * 12/2012 Hoshino .............. C07C 69/708 522/89
2004/0207999 A1 10/2004 Suehiro et al.
(Continued)

FOREIGN PATENT DOCUMENTS

CN 103395739 11/2013
DE 102018106707 9/2019
(Continued)

OTHER PUBLICATIONS

International Search Report and Written Opinion in International Appln. No. PCT/EP2021/066070, dated Oct. 18, 2021, 16 pages.
(Continued)

*Primary Examiner* — Alison L Hindenlang
*Assistant Examiner* — Debjani Roy
(74) *Attorney, Agent, or Firm* — Fish & Richardson P.C.

(57) ABSTRACT

A method includes treating a surface of a substrate to cause the surface to include a hydrophobic portion and a hydrophilic portion, providing a replication material over the hydrophilic portion, and imprinting the replication material to cause the replication material to have a predetermined characteristic.

19 Claims, 9 Drawing Sheets

(56) References Cited

U.S. PATENT DOCUMENTS

2007/0216048 A1* 9/2007 Rudmann .......... B29D 11/0048 264/1.7
2009/0027767 A1 1/2009 Souriau et al.
2009/0155549 A1* 6/2009 Hoshino ............... C07C 69/708 428/195.1
2009/0273124 A1 11/2009 Okinaka et al.
2010/0072640 A1* 3/2010 Rudmann ............. G03F 7/0002 264/2.5
2012/0091629 A1 4/2012 Kruijt-Stegeman et al.
2017/0087784 A1 3/2017 Bietsch et al.
2017/0137329 A1* 5/2017 Yilbas ................ B23K 26/0006
2020/0328248 A1* 10/2020 Matsugai ............... G03B 30/00

FOREIGN PATENT DOCUMENTS

JP 2011251508 12/2011
KR 100612292 8/2006
WO WO 2019131488 7/2019
WO WO-2019180031 A1 * 9/2019

OTHER PUBLICATIONS

International Preliminary Report on Patentability in International Appln. No. PCT/EP2021/066070, dated Dec. 29, 2022, 12 pages.
Communication pursuant to Article 94(3) EPC in European Appln. No. 21735862.1, mailed on Nov. 27, 2025, 11 pages.

* cited by examiner 104a
102
104b
100

106a
108a
106b
108b
106c 113
117
114
116
118
112
116
110a
110b 113
115
118
117
117
110a
110b 122
120
119
110a
110b
120
119
124
108a
104a
108b
104b

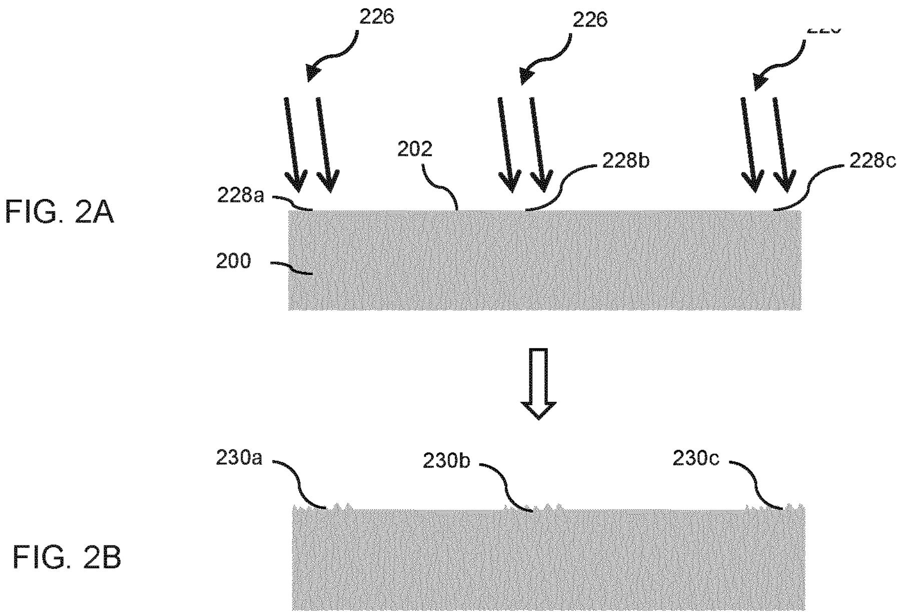
FIG. 2A
FIG. 2B
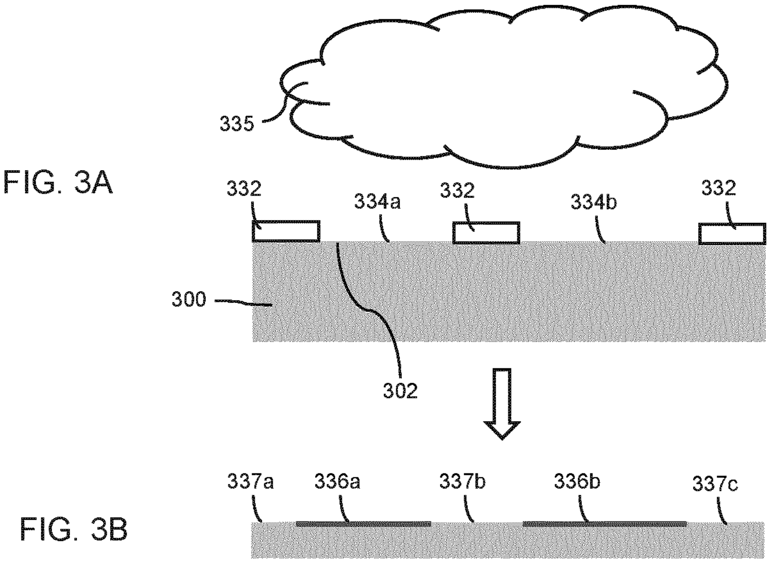
FIG. 3A
FIG. 3B 566
564
566
562
560
566
562
566
561
562
563
565

710
700
708
712
706
712
704
702

SURFACE TREATMENT FOR REPLICATION

BACKGROUND

In a replication process, a given structure or a negative thereof is reproduced. In some cases, a structure is reproduced in a replication material disposed on a substrate. Particular characteristics of the replication material or substrate may provide beneficial effects.

SUMMARY

In one aspect, the present disclosure describes a method that includes treating a surface of a substrate to cause the surface to include a hydrophobic portion and a hydrophilic portion, providing a replication material over the hydrophilic portion, and imprinting the replication material to cause the replication material to have a predetermined characteristic.

Implementations of the method may include one or more of the following. Spreading of the replication material onto the hydrophobic portion is limited by a hydrophobicity of the hydrophobic portion. The hydrophobicity of the hydrophobic portion is characterized by a water contact angle of greater than about 70 degrees. A hydrophobicity of the hydrophilic portion is characterized by a water contact angle of less than about 40 degrees. A hydrophobicity of the hydrophilic portion and the hydrophobicity of the hydrophobic portion are each characterized by a water contact angle, and a difference between the water contact angle of the hydrophilic portion and the water contact angle of the hydrophobic portion is greater than about 30 degrees.

In some implementations, treating the surface of the substrate includes directing laser light at the surface of the substrate. Treating the surface of the substrate includes plasma-treating the surface of the substrate. Treating the surface of the substrate includes providing a physical mask over the surface of the substrate, and plasma-treating the surface of the substrate to generate the hydrophilic portion in areas of the surface not covered by the physical mask. The predetermined characteristic includes a surface structure of the replication material.

In some implementations, treating the surface of the substrate includes at least one of roughening a portion of the surface to generate the hydrophobic portion, or smoothing a portion of the surface to generate the hydrophilic portion. Imprinting the replication material includes curing the replication material, and the cured replication material is configured to perform an optical function. The hydrophilic portion includes a plurality of hydrophilic areas, and the hydrophobic portion separates the plurality of hydrophilic areas from one another, the method further including dicing the substrate along the hydrophobic portion. The hydrophobic portion includes an inner hydrophobic barrier and an outer hydrophobic barrier, the inner hydrophobic barrier being smaller than the outer hydrophobic barrier and inside the outer hydrophobic barrier, and in which the hydrophilic portion is inside the inner hydrophobic barrier.

The disclosure also describes apparatuses. For example, an apparatus can include a substrate including a surface, and a replication material on a portion of the surface, the replication material configured to perform an optical function, in which a sidewall of the replication material includes a concave portion.

In some implementations, the replication material is on a hydrophilic portion of the surface, and the surface further includes a hydrophobic portion. The hydrophobic portion is rougher than the hydrophilic portion.

The disclosure also describes an apparatus that includes a substrate including a surface, the surface including a hydrophobic portion and a hydrophilic portion, and a replication material disposed on the hydrophilic portion, the replication material forming one or more optical elements.

In some implementations, the hydrophobic portion includes an inner hydrophobic barrier and an outer hydrophobic barrier, the inner hydrophobic barrier being smaller than the outer hydrophobic barrier and inside the outer hydrophobic barrier, and the hydrophilic portion is inside the inner hydrophobic barrier.

The disclosure also describes modules. For example, a module can include at least one of a light-emitting device or a light-sensitive device, and an optical device, in which the optical device includes a substrate including a surface, and a replication material on a portion of the surface of the substrate, in which a sidewall of the replication material includes a concave portion, and in which the optical device is configured (i) to interact with light generated by the light emitting device or (ii) to interact with light incident on the module such that light passing through the optical device is received by the light-sensitive device.

In some implementations, the module further includes an element supporting the optical device, in which an adhesive material binds the element to the concave portion of the sidewall.

Particular embodiments of the subject matter described in this specification can be implemented to realize one or more of the following advantages. In some implementations, a replication material may be prevented from spreading outside of a defined area. In some implementations, spreading of a replication material may be prevented during a replication process or other imprinting process. In some implementations, mechanical stress or warping in a device or during device processing may be reduced. In some implementations, replication material coverage across a particular area may be improved. In some implementations, delamination in a device or during device processing may be reduced. In some implementations, replication material or device density may be increased. In some implementations, a replication material in a replication process may better retain its replicated structure. In some implementations, device functionality may be enhanced. In some implementations, light interaction may be more precise. In some implementations, light interaction may be more reliable. In some implementations, device cosmetic characteristics may be improved. In some implementations, spread of an adhesive may be reduced. In some implementations, mechanical robustness of a module may be improved.

The details of one or more implementations are set forth in the accompanying drawings and the description below. Other features and advantages will be apparent from the description and drawings, and from the claims.

BRIEF DESCRIPTION OF THE DRAWINGS

FIGS. 2A-2B are schematics showing an example of a surface treatment process.

FIGS. 3A-3B are schematics showing an example of a surface treatment process.

DETAILED DESCRIPTION

Figures 1A, 1B, 1C, 1D, 1E:
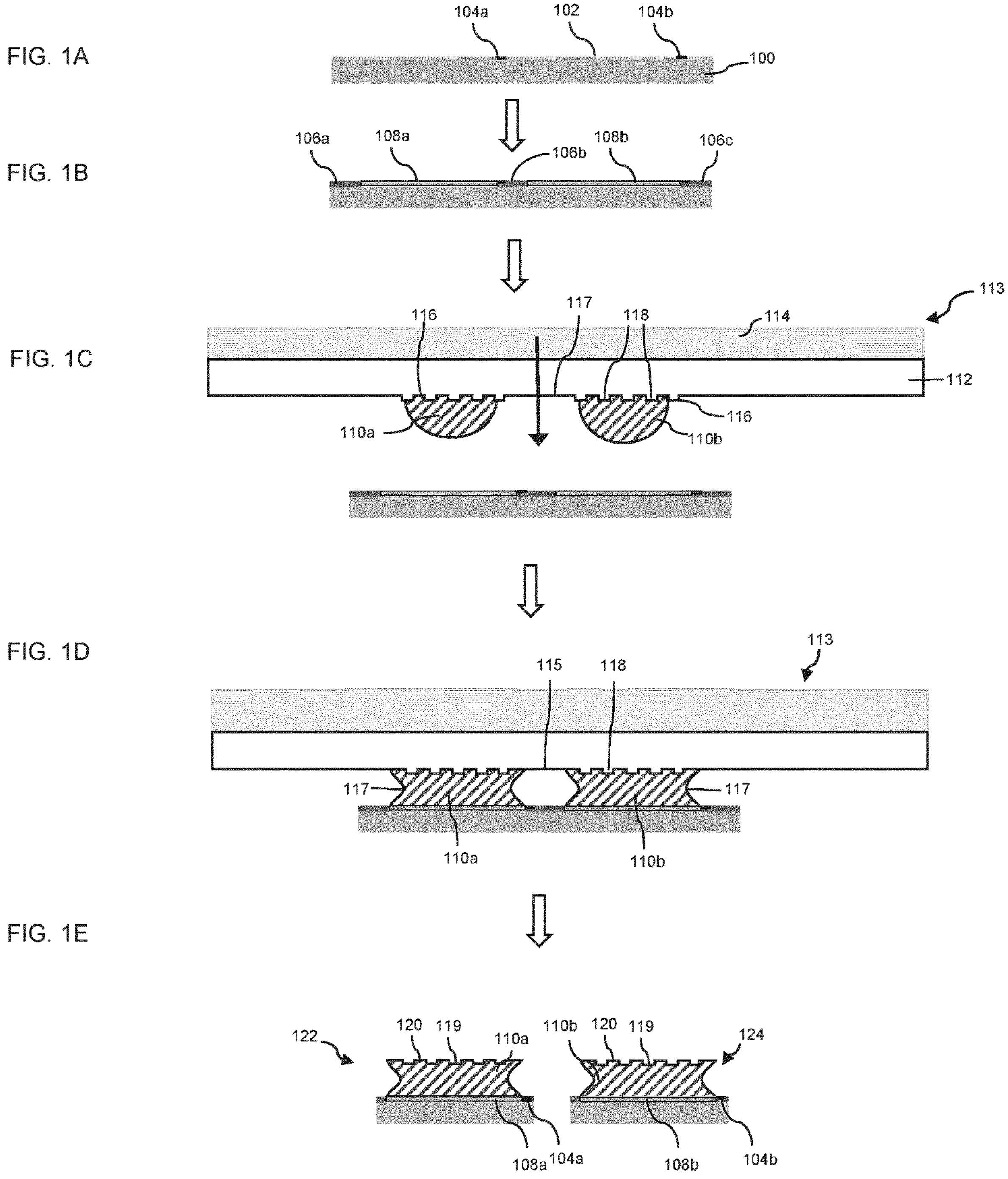
FIGS. 1A-1E are schematics showing an example of a surface treatment and replication process.

The present disclosure describes surface treatments for substrates used in replication processes. In particular, in certain implementations, this disclosure describes treating a substrate surface to cause the substrate surface to include a hydrophobic portion and a hydrophilic portion, depositing a replication material on the hydrophilic portion, and imprinting the replication material to cause the replication material to have a predetermined characteristic.

In general, replication refers to a technique by means of which a given structure or a negative thereof is reproduced, e.g., etching, embossing or molding. In a particular example of a replication process, a structured surface is embossed into a liquid, viscous, or plastically deformable material, then the material is hardened, e.g., by curing using ultraviolet radiation or heating, and then the structured surface is removed. Thus, a replica (which in this case is a negative replica) of the structured surface is obtained.

The replicated structure provides a mechanical, electrical, or optical functionality (or a combination of those functionalities) due to the structure imposed by the structured surface.

In some cases, replication may be implemented by stamping processes. In the case of a stamping process, which also may be referred to as an imprinting process, the structured surface is a surface of a stamp that is pressed into the liquid, viscous, or plastically deformable material (or has the liquid, viscous, or plastically deformable material pressed into it).

While the liquid, viscous, or plastically deformable material in an imprinting process may be a bulk material (for example, a block of material), in other implementations the liquid, viscous, or plastically deformable material is a replication material disposed on a substrate surface.

When the replication material is provided on the substrate surface (e.g., deposited onto the substrate surface), the replication material may spread, either before, during, or after imprinting by the stamp. Spreading of the replication material may cause undesirable effects in some cases.

For example, spreading of the replication material beyond a particular desired portion of the substrate surface may cause warping and mechanical stress across the substrate. This may lead to difficulty during imprinting: for example, if the substrate is warped from flat to curved, a flat stamp may no longer properly imprint the replication material across portions of the entire substrate surface. Warping and mechanical stress also may damage devices created by the replication process.

As another example, in some implementations, the replication material is deposited onto a plurality of defined separate portions of the substrate surface, and the substrate is diced between the separate portions after imprinting, such that each separate portion (along with the imprinted replication material on the separate portion) corresponds to a different device. In this case, if the replication material has spread into areas of the substrate surface between the defined separate portions, the replication material on the defined portions may delaminate or otherwise be damaged during imprinting or dicing. The replication material on areas of the substrate surface between the defined separate portions also may inhibit the dicing process.

Furthermore, replication material delamination may occur during stressing of a device. For example, temperature cycling, high temperatures, and/or high humidity may cause replication material delamination in a fabricated device. Spreading of a replication material across an entire substrate surface (as opposed to remaining in defined portions of a substrate surface) may increase the likelihood of such replication material delamination.

In addition, in some implementations, certain areas of the substrate surface include electrical contacts. Spreading of the replication material onto the electrical contacts may prevent proper access to the contacts.

Besides the possible practical consequences of replication material spreading beyond a particular desired portion of a substrate surface, such replication material spreading may cause a device to fail a visual (e.g., cosmetic) specification.

Therefore, in some cases, in can be beneficial to treat the substrate surface in order to reduce or prevent spreading of the replication material onto undesired portions of the substrate surface.

As shown in FIG. 1A, some implementations include a substrate 100 having a substrate surface 102. Depending on the implementation, the substrate 100 may be composed, for example, of a semiconductor material, a polymer material, or a composite material including metals and polymers, or polymers and glass materials. The substrate 100 may include hardenable materials such as thermally or UV-curable polymers. In some implementations, the substrate 100 is transparent, e.g., a glass. In some implementations, the substrate 100 is fully or partially flexible, e.g., a plastic.

In some implementations, the substrate 100 includes one or more electrical circuits. The electrical circuits, for example, may be configured to detect cracks in the substrate 100. In some implementations, cracks are detected by a resistive circuit design in which an open circuit (e.g., a high detected resistance) indicates a crack. In some implementations, an electrical circuit included in the substrate 100 may be configured to detect moisture. For example, moisture may be detected by a capacitive circuit design in which moisture or another contaminant changes a measured capacitance.

In some implementations, the electrical circuits may control or tune an optical function or parameter of an optical device including the circuit.

In some implementations, the electrical circuits may include contacts 104*a*, 104*b* at the substrate surface 102, the contacts 104*a*, 104*b* being usable, for instance, to read out signals from the electrical circuits.

In some implementations, the substrate surface 102 may include structures not shown in FIG. 1A, e.g., metasurfaces, waveguides, or other optical structures. Such structures disposed on all or part of the substrate surface 102 may be covered in a coating (e.g., the replication materials described below) as part of processing. In some implementations, the substrate surface 102 may not be flat, e.g., the substrate surface 102 may be curved or stepped.

As shown in FIG. 1B, the substrate surface 102 is treated in order to generate hydrophobic portions 106*a*, 106*b*, 106*c* and hydrophilic portions 108*a*, 108*b*. Further detail and examples regarding the surface treatment are disclosed below in reference to FIGS. 2-3.

In general, the hydrophobic portions are more hydrophobic than the hydrophilic portions, and the hydrophilic portions are more hydrophilic than the hydrophobic portions.

In addition, either the hydrophobic portions 106*a*, 106*b*, 106*c* or the hydrophilic portions 108*a*, 108*b* may be portions of an untreated substrate surface 102. That is, the surface treatment may cause, for example, a first portion of the substrate surface 102 to be more hydrophilic, leaving an untreated portion of the substrate surface 102 to be the hydrophobic portion. In some implementations, the surface treatment may cause a first portion of the substrate surface 102 to be more hydrophobic, leaving an untreated portion of the substrate surface to be the hydrophilic portion. In some implementations, one or more surface treatments both enhance the hydrophobicity of the hydrophobic portion and enhance the hydrophilicity of the hydrophilic portion.

As shown FIG. 1C, replication material portions 110*a*, 110*b* are provided on a stamp 113, which moves towards the substrate surface 102 to provide the replication material portions 110*a*, 110*b* on the hydrophilic portions 108*a*, 108*b*, respectively. The stamp 113 may include a stamping portion 112 (e.g., PDMS) attached to a stamp backing 114. The stamping portion 112 may include stamp surfaces 116. The stamp surfaces 116 may be structured, e.g., with the structures 118 shown in FIG. 1C. In some implementations, the stamp surfaces 116 are flat.

Various implementations may include different geometries and structures of the stamp 113. For example, in the example of FIG. 1C, the stamp surfaces 116 (which each include structures) each correspond to a respective replication material portion 110*a*, 110*b*, and a surface 117 between the stamp surfaces 116 is unstructured and not configured to imprint a structure into the replication material.

Figure 9:
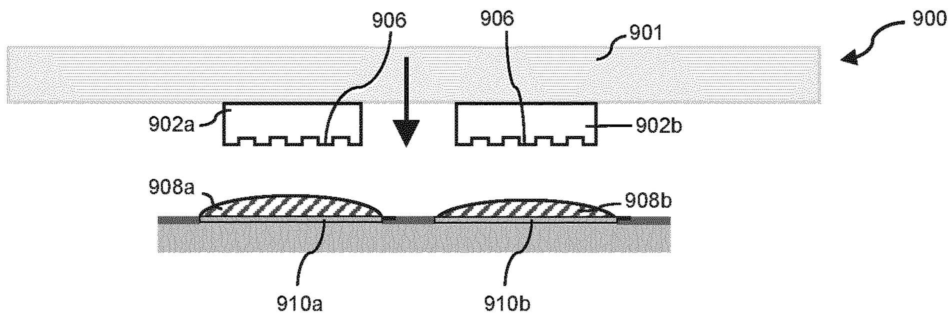
FIG. 9 is a schematic showing an example of a replication process.

In some implementations, the stamping portion 112 may be divided into separate portions. For example, as shown in FIG. 9, a stamp 900 includes multiple protruding stamping portions 902*a*, 902*b* attached to a backing 901, the stamping portions 902*a*, 902*b* extending towards a substrate 904. Each protruding stamping portion 902*a*. 902*b* includes a respective stamp surface 906 configured to imprint a respective portion of replication material 908*a*, 908*b* provided on a respective hydrophilic portion 910*a*, 912*b* of the substrate surface.

Although FIG. 1C shows replication material provided on a stamp and then provided on a substrate, in some implementations replication material is provided on the substrate (e.g., deposited on each hydrophilic portion of the substrate surface), and then a stamp is brought into contact with the replication material. FIG. 9 shows an example of moving a stamp towards a substrate according to this implementation, which may be combined with any of the examples described herein.

Each replication material portion 110*a*, 110*b* may have a volume of, for example, between about 0.01 and about 2 μL. In some implementations, no replication material is provided on the hydrophobic portions 106*a*, 106*b*, 106*c*.

The replication material may include, for example, one or more of a polymer, a spin-on-glass, nanoparticles dispersed in a solvent, or any other material that may be structured in a replication process. Suitable materials for replication include, for example, hardenable (e.g., curable) polymer materials or other replication materials, i.e. materials which are transformable in a hardening or solidification step (e.g., a curing step) from a liquid, viscous or plastically deformable state into a solid state. For example, the replication material may be a UV-curable and/or thermally-curable transparent epoxy.

The replication material may be deposited (on either the stamp or on the substrate surface, in various implementations) by printing (e.g., inkjet printing) or by another method. Examples of deposition methods are jetting, dispensing, and screenprinting. In some implementations, the replication material is deposited in portions of precisely known volumes (e.g., in volumes exact to within less than 3% of the deposited volume of each portion).

The replication material also may have characteristics suitable for a device resulting from the replication. For example, the replication material (in either as-deposited or cured form) may have a particular index of refraction, thermal or electrical conductivity, or chemical or physical resistance (e.g., low reactivity with atmospheric oxygen). A wide variety of materials suitable for replication may be used.

As shown in FIG. 1D, the stamp 113 is pressed against the replication material portions 110*a*, 110*b* while the replication material portions 110*a*, 110*b* are disposed on the substrate.

In some implementations, the stamp 113 is pressed toward the substrate surface 102 with a predetermined pressure or to a predetermined spatial extent. In some implementations, the stamp 113 is heated before or during the imprinting such that the stamp 113 is at an elevated temperature during the imprinting. This may cause the replication material to soften and to be shaped more easily by the stamping portion 112. In some implementations, the replication material is at an elevated temperature during the imprinting (e.g., by heating of the substrate 100). In some implementations, the stamp 113 is pressed against the replication material for a predetermined amount of time.

During imprinting, the hydrophobicity of the hydrophobic portions 106*a*, 106*b*, 106*c* (as compared to the hydrophilicity of the hydrophilic portions 108*a*, 108*b*) may restrict spreading of the replication material portions 110*a*, 110*b* substantially or entirely to the respective hydrophilic portions 108*a*, 108*b*. Although the replication material portions 110*a*, 110*b* may spread to the borders of the respective hydrophilic portions 108*a*, 108*b*, the replication material preferably does not spread substantially outside of the hydrophilic portions 108*a*, 108*b*.

Because the replication material may not spread substantially or at all outside of the hydrophilic portions 108*a*, 108*b*, the substrate 100 may warp less than if the replication material were to spread over a greater portion of the substrate surface 102. The substrate 100 and the replication material portions 110*a*, 110*b* may be under less mechanical stress than if the replication material spread over a greater portion of the substrate surface 102.

In addition, the hydrophilicity of the hydrophilic portions 108*a*, 108*b* may promote the spreading of the replication material throughout the entirety of the hydrophilic portions 108*a*, 108*b*. For example, the hydrophilic portions 108*a*, 108*b* may be rectangular, such that it may be difficult for a round droplet of replication material to reach corners of the rectangles and fill the entirety of the rectangles. The hydrophilicity may promote replication material spreading within hydrophilic portions have other shapes (e.g., irregular shapes and shapes including sharp tips).

"Imprinting," as used in this disclosure, may include other processes such as one or more of embossing, debossing, stamping, and nano-imprinting.

Subsequent to the stamp 113 imprinting the replication material, the replication material may be cured, e.g., to harden the replication material and cause surfaces 119 of the replication material portions 110*a*, 110*b* to have the replicated structure imposed by the stamp surfaces 116, as shown in FIG. 1E. The curing may include, for example, UV exposure, thermal treatment (e.g., heating), or both UV exposure and thermal treatment. In some implementations, the stamping portion 112 and the stamp backing 114 are transparent, and the UV exposure is directed through the stamp 113.

In some implementations, the replication material is cured while in contact with the stamp 113. In other implementations, stamp 113 is removed from contact with the replication material, after which the replication material is cured. In some implementations, the curing may be multi-step, e.g., a first curing step while the stamp 113 is in contact with the replication material, and a second curing step while the stamp 113 is not in contact with the replication material.

In some implementations, the imprinting of the replication material may cause the replication material to have a predetermined characteristic.

For example, the replication material may be imprinted such that the replication material, after imprinting, has a particular thickness or range of thicknesses. In accordance with some implementations, the replication material according to the present disclosure may be imprinted to have a thickness anywhere from the nanometer range to the millimeter range, or larger.

The replication material may be imprinted such that a surface of the replication material has a flatness within a desired range and/or a roughness within a desired range.

In some implementations, the predetermined characteristic of the replication material is an optical functionality based at least in part on the structures 120 replicated in the replication material surfaces 119. For example, after imprinting (in some implementations, including after curing), the replication material portions 110*a*, 110*b* may include diffractive optical elements including many pixels or individual structures, e.g., structures 120. The structures 120 may include, for example, pillars, posts, or ridges, which in some implementations may be arranged in arrays or other patterns. In some implementations, each structure 120 may have a dimension less than about 100 μm, less than about 20 μm, or less than about 1 μm.

The optical functionality may include, for example, one or more of lensing, focusing, reflecting or anti-reflecting, beamsplitting, or optical diffusing. The structures 120 may be microlenses, such that each replication material portion 110*a*, 110*b* after imprinting includes a microlens array. The structures 120 may include a diffractive optical element or a grating, e.g., a diffraction grating. The structures 120 after imprinting may include and/or form a metasurface having an optical functionality.

In some implementations, the predetermined characteristic is a non-optical functionality, e.g., hydrophobicity or hydrophilicity, in some cases determined by the form of the structures 120.

As shown in FIG. 1D, because of a geometry of the stamp 113 (e.g., a substantially planar surface 115 of the stamping portion 112, including structures 118 to imprint respective replication material portions), because of the hydrophilic surface portions 108*a*, 108*b* (e.g., causing a lower contact angle of the replication material with the substrate surface), or because of a combination of these factors, sidewalls 117 of the replication material portions have a concave shape after imprinting. In some implementations, an unstructured portion of the stamping surface 115 may be configured to be wide enough to allow for a concave sidewall to be formed. In some implementations, a concave sidewall may provide advantages, as discussed in reference to FIGS. 8A-8D below.

In some implementations, the sidewalls 117 may have different profiles (e.g., straight or convexly curved).

In some implementations, after the stamp 113 has been removed from contact with the replication material (and, in some implementations, after the replication material has been cured), the substrate 100 may be diced in the hydrophobic portions 106*a*, 106*b*, 106*c*, e.g., between the replication material portions 110*a*, 110*b*. The result, as shown in FIG. 1E, is two separate devices 122, 124, each device including a respective imprinted replication material portion. The devices 122, 124 may operate to modify or otherwise interact with light, e.g., modify light traveling through the replication material portions 110*a*, 110*b* based on the optical functionalities described above.

Because the replication material does not spread substantially or at all outside of the hydrophilic portions 108*a*, 108*b*, delamination of the replication material during imprinting, curing, or dicing, or during stressing of a fabricated device, may be reduced or prevented. Therefore, the resulting devices 122, 124 may function more effectively, because, for example, the replication material portions 110*a*, 110*b* may retain the replicated structure of the stamp, with reduced loss of replication material or distortion of the structures 120. In addition, a cosmetic yield of the fabrication process may be improved.

Furthermore, the devices 122, 124, which include hydrophilic and hydrophobic portions, the replication material being disposed on the hydrophilic portions, may operate more effectively than devices that do not include hydrophilic and hydrophobic portions. For example, an optical functionality of the devices may be enhanced or more precise. Light transmitted through or modified by the devices may be directed and/or modified more precisely or reliably.

In addition, because spreading of the replication material onto the circuit contacts 104*a*, 104*b* may be prevented by the relative hydrophobicity/hydrophilicity of portions of the substrate surface, the electrical contacts 104*a*, 104*b* may be accessed without, for example, having to puncture through a layer of replication material on top of the contacts 104*a*, 104*b*. Rather, the contacts 104*a*, 104*b* already may be exposed at the substrate surface.

Although FIGS. 1A-1E show examples including two replication material portions disposed on respective hydrophilic portions of the substrate surface, other implementations may include only one replication material portion, or more than two replication material portions, disposed on respective hydrophilic portions.

Further, although FIGS. 1A-1E show two replication material portions undergoing a replication process, such that the same structure is replicated in each replication material portion, in some implementations different replication processes (for example, be imprinted to have different structures) may be applied to different replication material portions.

FIGS. 2A-2B show an example of surface treatment to create hydrophilic and hydrophobic portions of a substrate surface. In FIG. 2A, a substrate surface 202 of a substrate 200 is illuminated with laser light 226. The laser light 226 is directed at portions 228*a*, 228*b*, 228*c* of the substrate surface 202.

Selective illumination by the laser light 226 may be carried out, in various implementations, using a scanning laser system or an optical mask.

In the example of FIG. 2B, the laser light treatment creates hydrophobic portions 230*a*, 230*b*, 230*c* of the substrate surface 202. In some implementations, the laser light 226 does this by selectively roughening the substrate surface 202, with the rougher portions of the substrate surface then being the hydrophobic portions 230*a*, 230*b*, 230*c*.

In some implementations, laser light treatment may smooth the substrate surface, thereby creating hydrophilic portions of the substrate surface. In some implementations, the laser light treatment may cause a chemical reaction at the substrate surface, thereby creating hydrophilic or hydrophobic portions of the substrate surface. In some implementations, rather than, or in addition to, laser light, a surface treatment includes a different type of light, e.g., incoherent illumination. Light used for a surface treatment may include, in various implementations, one or more of visible light, infrared light, UV light, or any other wavelength of light.

FIGS. 3A-3B show another example of surface treatment to create hydrophilic and hydrophobic portions of a substrate surface. In FIG. 3A, a substrate surface 302 of a substrate 300 is masked by a physical mask 332. Un-masked portions 334*a*, 334*b* of the substrate surface 302 are exposed to a plasma 335, which may be, for example, an oxygen plasma.

In the example of FIG. 3B, the plasma treatment creates hydrophilic portions 336*a*, 336*b* of the substrate surface 302, corresponding to the un-masked portions 334*a*, 334*b*. The portions exposed to the plasma may be more hydrophilic than the portions that were masked during the plasma treatment. The masked portions (e.g., portions 337*a*, 337*b*, 337*c*) are the hydrophobic portions of this example.

The physical mask 332 may be, for example, a photoresist mask or other mask (e.g., a metal mask) patterned using photolithography. In some implementations, the physical mask 332 is a shadow mask (e.g., a metal shadow mask) positioned on or close to the substrate, to shadow the substrate surface from the plasma.

Other surface treatments, besides those shown in FIGS. 2-3, may be used to cause portions of the substrate surface to be relatively hydrophilic and hydrophobic. For example, the plasma treatment of FIGS. 3A-3B may create, in some implementations, hydrophobic surface portions corresponding the un-masked portions. In various implementations, a surface treatment may include one or more of a selective chemical treatment, lithography to create surface structures, and selective deposition of materials (e.g., metal, in some examples also serving as an optical mask) that may be hydrophilic or hydrophobic compared to the material of the substrate surface.

In some implementations, material deposition may be combined with another treatment. For example, a substrate surface may include deposited metal. The metal may be, for example, a chrome layer that defines optical apertures in portions of the substrate surface that are to include a replication material. In reference to FIG. 1B, for example, surface portions 106*a*, 106*b*, 106*c* may be coated with chrome, the chrome defining, in the finished devices 122, 124 of FIG. 1E, apertures through which light may travel through the substrate and the replication material portions 110*a*, 110*b*. The light is modified by the optical functioning of the replication material portions 110*a*, 110*b*.

Plasma treatment may have a more significant effect on some surfaces than on others. For example, the plasma treatment may cause greater relative hydrophilicity on glass or semiconductor surfaces than on metal surfaces. Therefore, if the substrate surface includes, for example, a chrome optical masking layer, the chrome optical masking layer may be made comparatively more hydrophobic by a plasma treatment, thereby serving as a hydrophobic portion of the substrate surface.

In some implementations, the chrome optical masking layer, or another layer, may itself be relatively hydrophobic, such that additional surface treatment is not necessary to generate the hydrophobic and hydrophilic portions.

In some implementations, the entirety of the substrate surface may be plasma-treated, after which certain portions of the substrate surface (e.g., 106*a*, 106*b*, 106*c*) may be laser-treated in order to make those portions hydrophobic.

In some implementations, a surface treatment includes causing a portion of the substrate surface to be more polar or non-polar, in order to make the portion of the substrate surface relatively more hydrophobic or hydrophilic.

In some implementations, the hydrophobicity and hydrophilicity of the hydrophobic and hydrophilic surface portions may be characterized quantitatively. Often, this characterization is done in terms of a contact angle. The contact angle is an angle formed by a drop of liquid (for example, water) with respect to the substrate surface.

Figure 4:
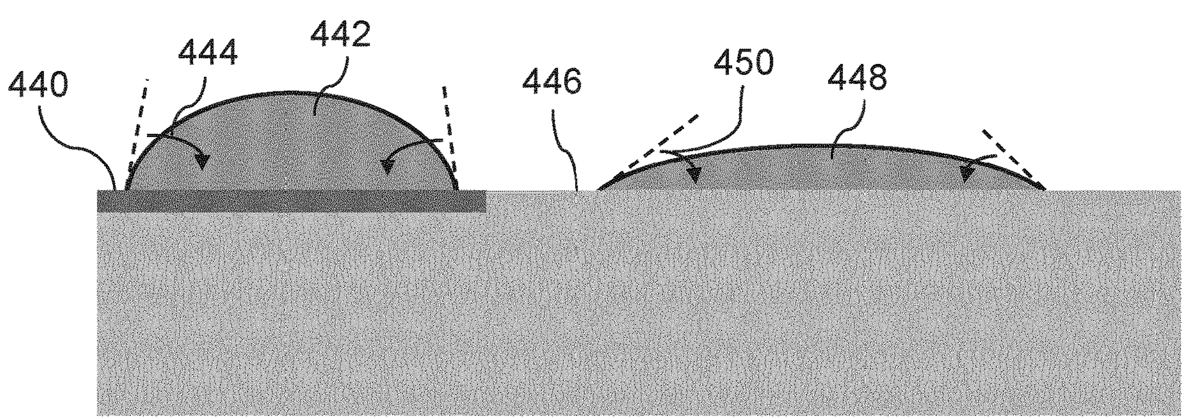
FIG. 4 is a schematic showing examples of contact angles on substrate surfaces.

For example, as shown in FIG. 4, on a hydrophobic surface portion 440, a water droplet 442 has a contact angle 444, and a water droplet 448 on the hydrophilic surface portion 446 has a contact angle 450. As shown, the hydrophilic contact angle 450 is smaller than the hydrophobic contact angle 444. In some implementations, the hydrophobic contact angle 444 is greater than about 70 degrees. In some implementations, the hydrophilic contact angle 450 is less than about 40 degrees.

In some implementations, the absolute difference between the hydrophilic contact angle 450 and the hydrophobic contact angle 444 may partially or wholly determine the extent to which spreading of the replication material on the hydrophobic surface portions is inhibited. For example, in some implementations, a larger absolute difference may correspond to increased effectiveness in inhibiting spreading of the replication material onto the hydrophobic surface portions.

In some implementations, the difference between the hydrophilic contact angle 450 and the hydrophobic contact angle 444 is greater than about 30 degrees (for example, the hydrophobic contact angle 444 may be 70 degrees, and the hydrophilic contact angle 450 may be 40 degrees). In some implementations, the angle difference may be greater than about 35 degrees. In some implementations, the angle difference may be greater than about 40 degrees. In some implementations, the angle difference may be greater than about 45 degrees.

The contact angles disclosed above in reference to water droplets may equally apply to contact angles measured using droplets of the replication material used in the replication processes.

Figure 5:
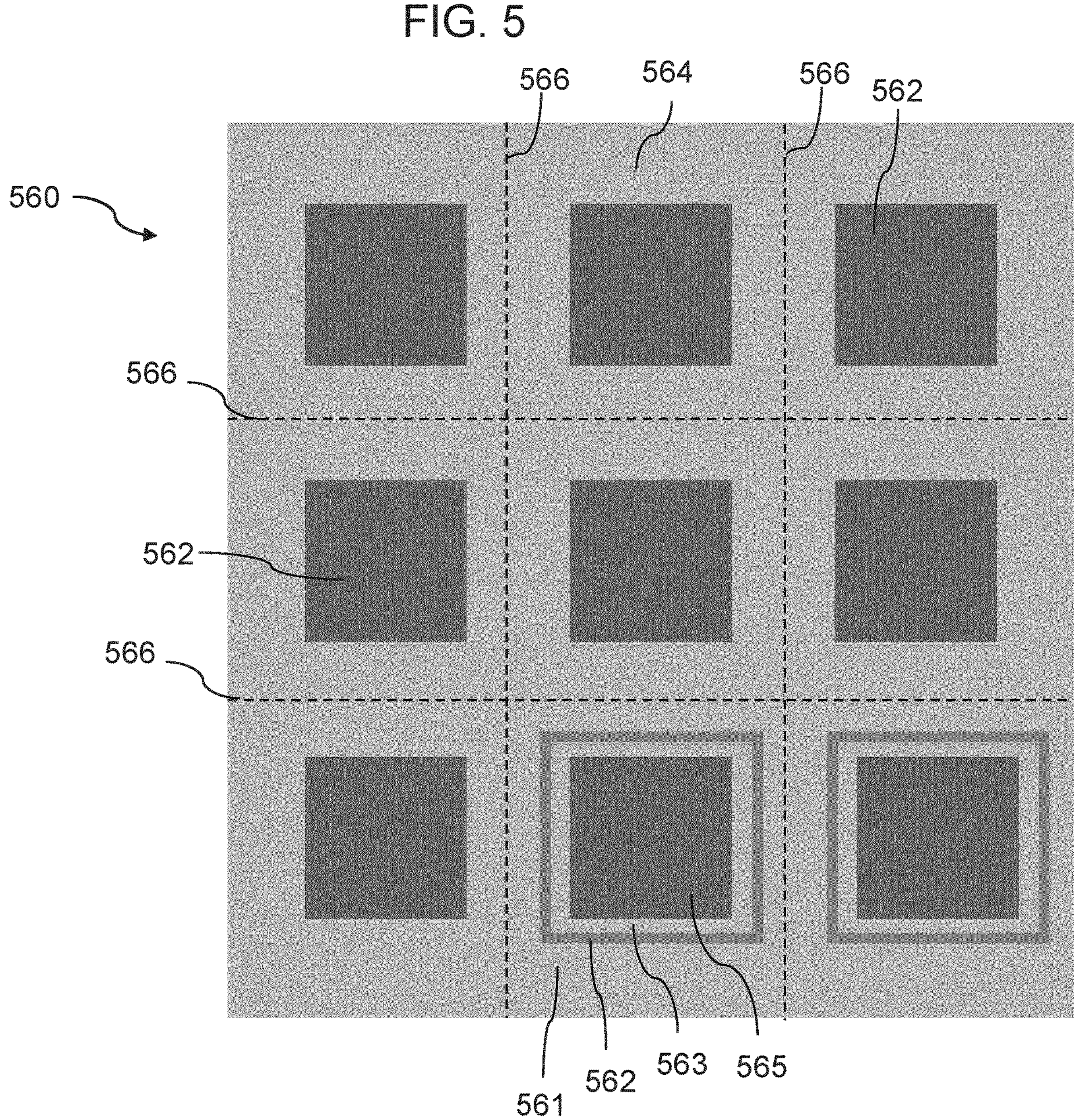
FIG. 5 is a top-down schematic showing an example of a treated substrate surface.

As shown in FIG. 5, in some implementations a substrate surface 560 (shown in a top-down view, as opposed to the profile view of FIGS. 1A-4) is caused to include an array of hydrophilic portions (e.g., hydrophilic portions 562) separated by a hydrophobic portion 564. Droplets of replication material (not shown) may be provided onto each hydrophilic portion 562, imprinted either in parallel or sequentially, and cured. The underlying substrate then may be diced along the dicing tracks 566, which, in the example of FIG. 5, coincide with the hydrophobic portion 564. When diced into separate pieces, replication material on each hydrophilic portion 562 forms part of a respective separate optical device.

In some implementations, each respective separate optical device may have dimensions (e.g., width and length) of, for example, between about 0.5 mm and about 20 mm.

The relatively hydrophobic and hydrophilic portions of the substrate surface 560 may provide advantages during processing or in a finished device. Because the separate droplets of replication material may be constrained substantially to the hydrophilic portions, a higher droplet density (potentially corresponding to a higher density of finished devices after dicing) may be achieved. In addition, as described above, delamination, warping, mechanical stress, and structure damage may be reduced by limiting the spreading of replication material during replication processing.

FIG. 5 also shows another example of hydrophilic and hydrophobic surface geometries. In some implementations, two concentric or nested hydrophobic barriers 561, 563 are formed around a hydrophilic portion 565 of a substrate surface. Replication material that spreads beyond the inner hydrophobic barrier 563 may be prevented from further spreading by the outer hydrophobic barrier 561. This may help to restrict replication material overflow to certain areas (e.g., a portion 567 of the substrate surface between the two hydrophobic barriers) and protect other areas (e.g., an area outside the outer hydrophobic barrier 561) from being covered by the replication material. The barriers 561, 563 may have various shapes, e.g., square outlines or rings.

In some implementations, excess flow of replication material is caused by an excess of deposited replication material or an unexpectedly small distance between the stamp and the substrate.

In some implementations, an optical device including a replication material on a substrate may be characterized by the geometry of the replication material. This geometry may indicate that the optical device was fabricated by a method including imprinting a replication material disposed on a substrate surface, the substrate surface including relatively hydrophobic and hydrophilic portions. However, in some implementations, the device geometries described below may occur irrespective of a method of fabrication of the optical device.

Figure 6A:
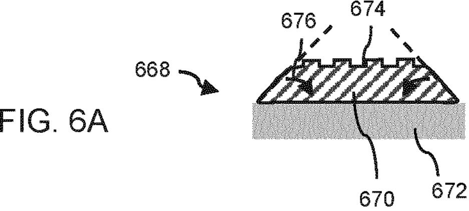
FIGS. 6A-6B are schematics showing examples of devices including a replication material.

As shown in FIG. 6A, a device 668 includes a replication material 670 disposed on a substrate 672. The replication material 670 may include, for example, a resin, an epoxy, a polymer, or another material. The replication material 670 has a structure (e.g., a structure 674 on a surface of the replication material 670) that provides an optical functionality. As described above in reference to FIGS. 1A-1E, the optical functionality may include, for example, one or more of lensing, reflecting or anti-reflecting, beamsplitting, or optical diffusing. The replication material 670 and substrate 672 may have some or all of the characteristics disclosed above in reference to the previously-described implementations.

The replication material 670 has a contact angle 676 with the substrate surface. In some implementations, the contact angle 676 is indicative of a relative hydrophilicity of a portion of the substrate surface that includes the replication material 670. The contact angle 676 may be, for example, less than about 40 degrees.

Figure 6B:
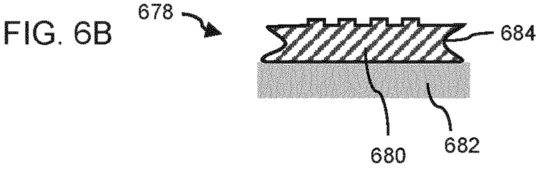

The example device 678 shown in FIG. 6B also includes a replication material 680 disposed on a substrate 682, the device 678 having characteristics and one or more optical functionalities as disclosed above. A sidewall 684 of the replication material in the illustrated example has a concave shape. In some implementations, the concave shape of the sidewall 684 is indicative of a relative hydrophilicity of a portion of the substrate surface on which the replication material 670 is disposed. In some implementations, the concave shape of the sidewall 684 is indicative of a shape of a stamp used to imprint the replication material.

The example devices 670 and 678 include respective replication materials on only defined portions of their respective substrate surfaces. For example, the replication materials cover only a single contiguous area of the respective substrate surfaces, each contiguous area being surrounded by a portion of the substrate surface that does not include a replication material. In some implementations, this characteristic of the device and replication material is indicative of a relative hydrophilicity of a portion of the substrate surface that includes the replication material.

Because the replication materials in the example devices 670 and 678 are disposed on only some portions of their respective substrate surfaces, the devices 670, 678 may operate more effectively than if the replication material were spread across more of the substrate surfaces. For example, an optical functionality of the devices may be enhanced or more precise. Light transmitted through or modified by the devices may be directed and/or modified more precisely or reliably.

Figure 7:
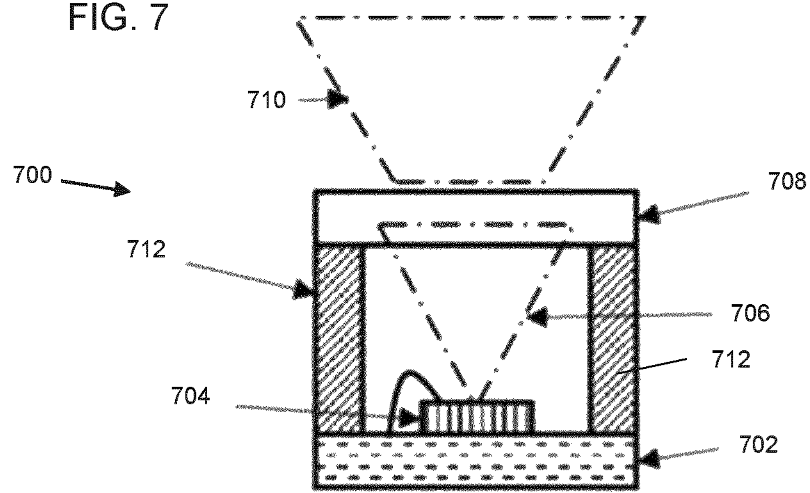
FIG. 7 is a schematic showing an example of an opto-electronic module.

In some implementations, devices fabricated by a process including the surface treatments described above, or devices with a replication material having one or more characteristics described above, may be integrated into optoelectronic or other modules. As shown in FIG. 7, a module 700 includes a substrate 702 and a light-emitting component 704 coupled to or integrated into the substrate 702. The light-emitting component 704 may include, for example, a laser (for example, a vertical-cavity surface-emitting laser) or a light-emitting diode.

Light 706 generated by the light-emitting component 704 is transmitted through a housing and then to an optical device 708, e.g., an optical device as shown in FIG. 1E, 6A, or 6B. The optical device 708 is operable, as described above, to modify the light 706, such that modified light 710 is transmitted out of the module 700. For example, the module 700, using the optical device 708, may produce one or more of structured light, diffused light, or patterned light. The housing may include, for example, spacers 712 separating the light-emitting component 704 and/or the substrate 702 from the optical device 708.

In some implementations, the module 700 of FIG. 7 is a light-sensing module (for example, an ambient light sensor), the component 704 is a light-sensing component (for example, a photodiode, a pixel, or an image sensor), the light 706 is incident on the module 700, and the light 710 is modified by the optical device 708. For example, the optical device 708 may focus patterned light onto the light-sensing component 704.

In some implementations, the module 700 may including both light-emitting and light-sensing components. For example, the module 700 may emit light that interacts with an environment of the module 700 and is then received back by the module 700, allowing the module 700 to act, for example, as a proximity sensor or as a three-dimensional mapping device.

The modules described above may be part of, for example, time-of-flight cameras or active-stereo cameras. The modules may be integrated into systems, for example, mobile phones, laptops, television, wearable devices, or automotive vehicles.

The optical device 708 may provide advantages to the module 700 compared to modules that do not include an optical device 708 as described in this disclosure. For example, because spreading of a replication material in the optical device 708 may be limited (e.g., by comparatively hydrophobic and hydrophilic portions of a substrate surface), and/or because spreading of a replication material in the optical device 708 may be enhanced in a portion of a substrate surface (e.g., a hydrophilic portion of the substrate surface), delamination, warping, mechanical stress, and structure damage may be reduced by the limiting of replication material spreading during replication processing. Light emitted, detected, or modified by the module 700 may be more precisely or reliably directed and/or modified. A cosmetic yield of the fabrication process of the module 700 may be improved.

Figure 8A:
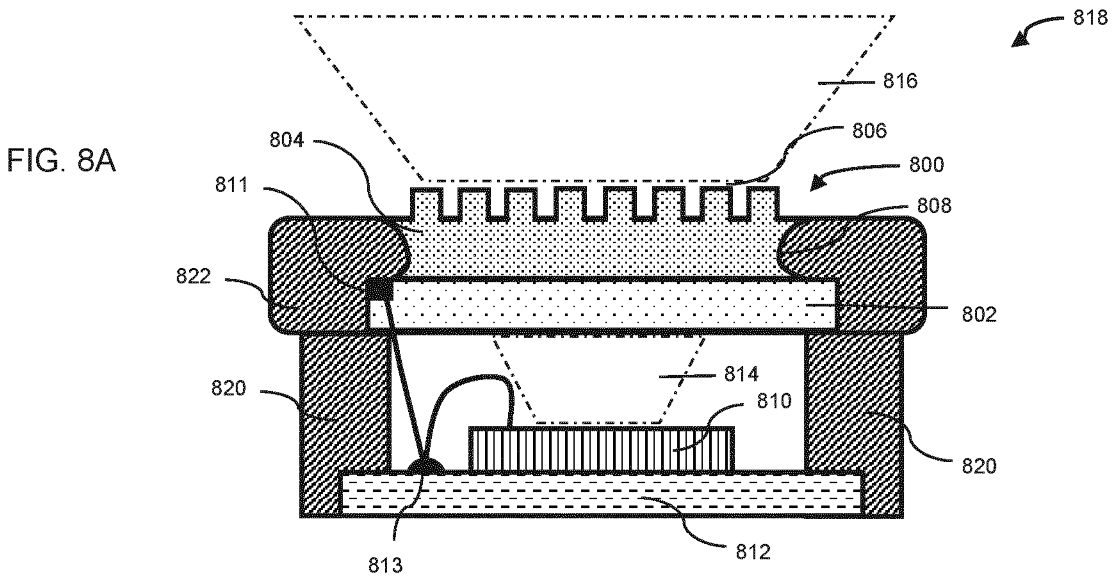
FIGS. 8A-8D are schematics showing examples of opto-electronic modules.
Figure 8B:
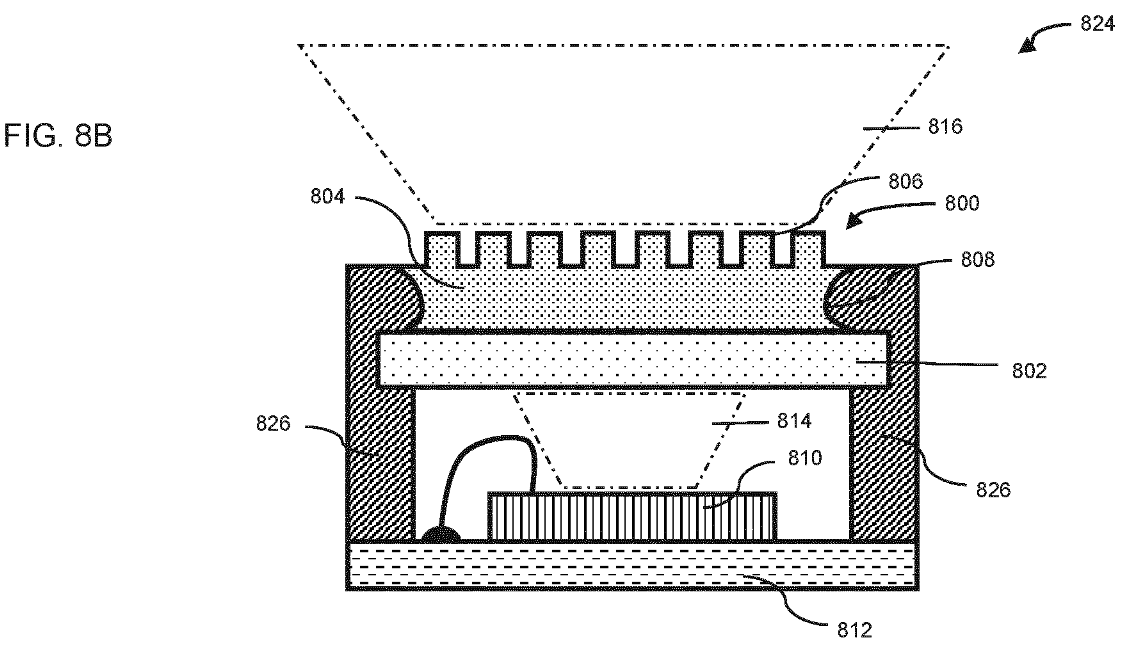
Figure 8C:
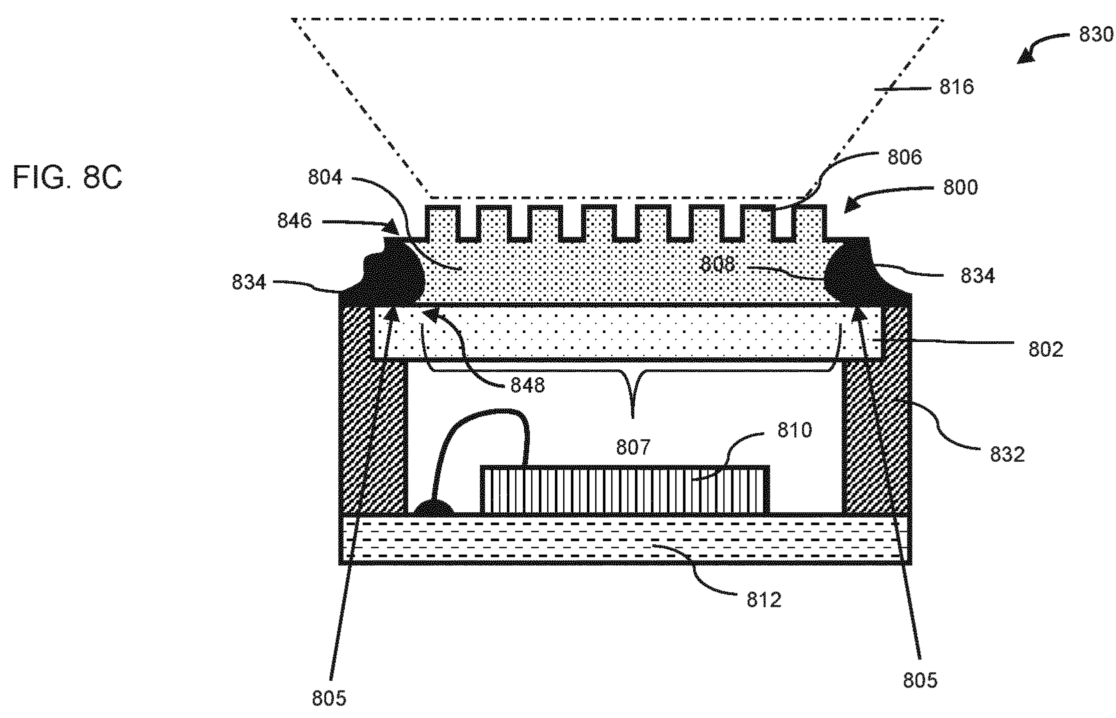

FIGS. 8A-8D show examples of modules including an optical device having a concave sidewall. In each of FIGS. 8A-8D, the optical device 800 includes a substrate 802 and a replication material 804 formed on the substrate 802, the replication material 804 having a structured surface 806 that provides an optical functionality to the optical device 800. The replication material 804 includes a concave sidewall 808. A surface of the substrate may include a hydrophobic portion (e.g., portions 805 as shown in FIG. 8C) and a hydrophilic portion (e.g., portion 807 as shown in FIG. 8C), with the replication material 804 limited to the hydrophilic portion, these portions providing the advantages described above. The concavity of the sidewall 808 may be indicative of a relative hydrophilicity of a portion of the substrate surface that includes the replication material 804.

Each module of the examples of FIGS. 8A-8D also includes a light-emitting and/or light-sensing component 810 coupled to or integrated into a second substrate 812. The optical device 800 is configured to interact with light 814 generated by the light-emitting component, and/or interact with light 816 incident on the module such that light 814 transmitted through optical device 800 is received by the light-sensing device. Functions of the optical devices 800 and modules may include the functions given above in reference to FIG. 7.

In the example of FIG. 8A, the module 818 includes spacers 820. The spacers 820 support and are attached to an element 822 (for example, a polymeric element, e.g., a PCB wafer). The element 822 is attached to the concave sidewall 808 (e.g., by an epoxy). The spacers 820 may be composed of, for example, a polymer, a metal (e.g., a lead frame), or another material.

The example of FIG. 8A also includes an electrical contact 811 on a surface of the substrate 802. Because, in some implementations, replication material that would otherwise cover the electrical contact 811 was prevented from spreading onto the electrical contact 811, the electrical contact 811 may be accessed.

The electrical contact 811 is communicatively coupled to circuit elements 813 of the module, such that a circuit included in the optical device 800 is usable by the module 818. As described above, a circuit included in the optical device 800 may be usable to control operation of the optical device 800 or to monitor characteristics (e.g., temperature) of the optical device 800.

Figure 8D:
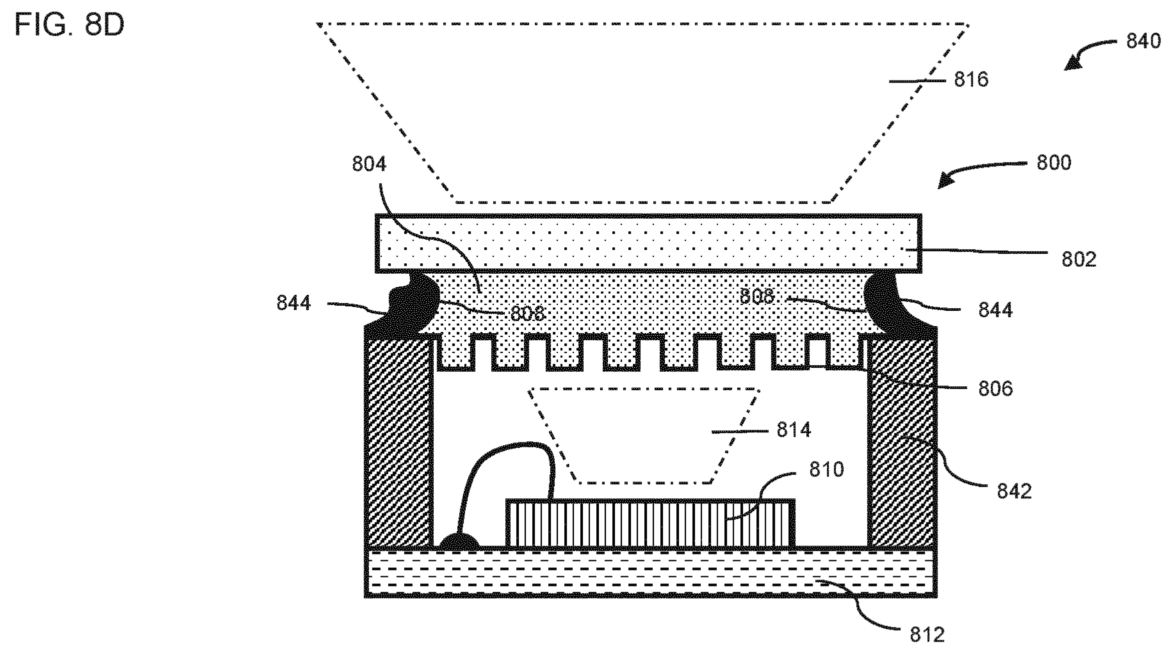

Electrical contacts and circuits also may be included in implementations according to FIGS. 8B-8D.

In the example of FIG. 8B, the module 824 includes spacers 826 that are attached to the concave sidewall 808 (e.g., by an epoxy). In some implementations, the spacers 826 are composed of a polymer and are formed by injection molding.

The example modules (and the optical devices therein) of FIGS. 8A-8B, in some implementations, may provide advantages over modules and optical devices that do not include a concave sidewall on a replication material. For example, the concavity of the sidewall 808 may increase a surface area of attachment between the optical device 800 and the element 822 or the spacer 826, thereby increasing a mechanical robustness of the modules. In a further advantage, the concavity of the sidewall 808 may cause increased light-blocking for light incident on the module.

In the example of FIG. 8C, the module 830 includes a spacer 832 attached to the concave sidewall 808 by an adhesive 834. The spacer 832 may be composed, for example, of a polymer, a metal (e.g., a lead frame), or another material.

In the example of FIG. 8D, the module 840 includes a spacer 842 that is attached to the concave sidewall 808 by an adhesive 844. The optical device 800 is configured such that the structured replication material 804 faces the light-emitting and/or light-sensing component 810 within the module 840. The spacer 832 may be composed of, for example, a polymer, a metal (e.g., a lead frame), or another material.

The example modules (including the optical devices therein) of FIGS. 8C-8D, in some implementations, provide advantages over modules and optical devices that do not include a concave sidewall on a replication material. For example, the concave sidewall 808 may act as a barrier to spreading of the adhesion 834, 844 (e.g., spreading of the adhesion onto the structured surface 806, or onto another optically active portion of the module). This may be at least because of a corner (e.g., corners 846, 848) at an edge of the concave sidewall 808.

In addition, the concavity of the sidewall 808 may increase a surface area of attachment between the optical device 800 and the spacers 832, 842, thereby increasing a mechanical robustness of the modules. In a further advantage, the concavity of the sidewall 808 may cause increased light-blocking for light incident on the module.

For at least these reasons, the example modules (and the optical devices therein) of FIGS. 8A-8D may, in some implementations, provide advantages over modules and optical devices that do not include a concave sidewall of a replication material disposed on a substrate.

Although this disclosure has used the terms "hydrophobic" and "hydrophilic," in some implementations, portions of the substrate surface are configured to attract and/or be less attractive to the provided replication material without behaving the same way towards water provided on those portions of the substrate surface. For example, if the replication material includes non-polar molecules, a first portion of the substrate surface (equivalent to the hydrophobic portion disclosed above) may be treated to be polar, in order to have low attraction to the replication material. Alternatively, or in addition, a second portion of the substrate surface (equivalent to the hydrophilic portion disclosed above) may be treated to be non-polar, in order to have higher attraction to the replication material. The examples and implementations described above should be understood to also refer to, in general, substrate portions that are relatively more or less attractive to the provided replication material, without being limited to "hydrophobic" and "hydrophilic."

Although this disclosure sometimes refers to optical devices, the methods, devices, and modules described are not limited to, nor required to include, optical functionality. For example, replication material may be provided and processed on a substrate surface having hydrophobic and hydrophilic portions in order to fabricate non-optical devices, or devices that have both an optical functionality and a non-optical functionality. Devices including a replication material on a substrate, the device having the characteristics described above, may have a non-optical functionality.

Therefore, in accordance with the various embodiments of the disclosure, improved methods and devices are described for treating a substrate surface to be used in a replication or other imprinting process.

Various modifications will be readily apparent. For example, the actions described can, in some instances, be performed in a different order and still achieve desirable results. As one example, the processes depicted in the accompanying figures do not necessarily require the particular order shown, or sequential order, to achieve desirable results. In some cases, multitasking and parallel processing may be advantageous.

It should be noted that any of the above-noted inventions may be provided in combination or individually. Elements of different embodiments described herein may be combined to form other embodiments not specifically set forth above.

Accordingly, other implementations are also within the scope of the claims.

What is claimed is:

1. A method comprising:

treating a surface of a substrate to cause the surface to comprise a hydrophobic portion and a hydrophilic portion;

providing a replication material over the hydrophilic portion; and imprinting the replication material using a stamp, to cause the replication material to have a predetermined characteristic, wherein the imprinting the replication material comprises curing the replication material to provide a cured replication material, wherein the imprinting the replication material further comprises forming a plurality of individual structures on an upper surface of the replication material, wherein the plurality of individual structures of the cured replication material are configured to perform an optical function, and wherein sidewalls of the cured replication material each comprise a concave portion, wherein the sidewalls correspond to portions of the replication material that are free from contact with the stamp during the imprinting the replication material, wherein the hydrophobic portion comprises an inner hydrophobic barrier and an outer hydrophobic barrier, wherein the inner hydrophobic barrier is nested within the outer hydrophobic barrier and spaced apart from the outer hydrophobic barrier, and wherein the hydrophilic portion comprises an area inside the inner hydrophobic barrier.

2. The method of claim 1, wherein spreading of the replication material onto the hydrophobic portion is limited by a hydrophobicity of the hydrophobic portion.

3. The method of claim 2, wherein the hydrophobicity of the hydrophobic portion is characterized by a water contact angle of greater than about 70 degrees.

4. The method of claim 2, wherein a hydrophobicity of the hydrophilic portion is characterized by a water contact angle of less than about 40 degrees.

5. The method of claim 2, wherein a hydrophobicity of the hydrophilic portion and the hydrophobicity of the hydrophobic portion are each characterized by a water contact angle, and wherein a difference between the water contact angle of the hydrophilic portion and the water contact angle of the hydrophobic portion is greater than about 30 degrees.

6. The method of claim 1, wherein treating the surface of the substrate comprises directing laser light at the surface of the substrate, wherein the laser light causes a portion of the substrate illuminated by the laser light to become hydrophobic or hydrophilic.

7. The method of claim 1, wherein treating the surface of the substrate comprises plasma-treating the surface of the substrate.

8. The method of claim 7, wherein treating the surface of the substrate comprises:

providing a physical mask over the surface of the substrate, and plasma-treating the surface of the substrate to generate the hydrophilic portion in areas of the surface not covered by the physical mask.

9. The method of claim 1, wherein the predetermined characteristic comprises a surface structure of the replication material.

10. The method of claim 1, wherein treating the surface of the substrate comprises at least one of:

roughening a portion of the surface to generate the hydrophobic portion, or smoothing a portion of the surface to generate the hydrophilic portion.

11. The method of claim 1, wherein imprinting the replication material comprises curing the replication material.

12. The method of claim 1, wherein the hydrophilic portion comprises a plurality of hydrophilic areas, and wherein the hydrophobic portion separates the plurality of hydrophilic areas from one another, the method further comprises:

dicing the substrate along the hydrophobic portion.

13. The method of claim 1, wherein the hydrophilic portion comprises a second area in-between the inner hydrophobic barrier and the outer hydrophobic barrier, wherein the second area is spaced apart from the area inside the inner hydrophobic barrier.

14. The method of claim 1, wherein each structure of the plurality of individual structures of the cured replication material has a dimension less than about 100 μm.

15. The method of claim 1, wherein the plurality of individual structures of the cured replication material are configured to perform one or more optical functionalities from the list consisting of: lensing, focusing, reflecting, anti-reflecting, beamsplitting, and optical diffusing.

16. The method of claim 1, wherein the inner hydrophobic barrier has a shape of a square outline or a ring.

17. The method of claim 1, wherein the outer hydrophobic barrier entirely surrounds the inner hydrophobic barrier.

18. The method of claim 1, wherein the hydrophilic portion comprises:

a first hydrophilic portion comprising the area inside the inner hydrophobic barrier, and a second hydrophilic portion spaced apart from the first hydrophilic portion, wherein the hydrophobic portion comprises a second inner hydrophobic barrier, wherein the second hydrophilic portion comprises an area inside the second inner hydrophobic barrier, and wherein the second inner hydrophobic barrier is nested within a same continuous portion outer hydrophobic barrier as the inner hydrophobic barrier is nested within.

19. The method of claim 1, wherein the outer hydrophobic barrier entirely surrounds a plurality of spaced-apart areas of the hydrophilic portion.

* * * * *